United States Patent
Kim et al.

(10) Patent No.: US 9,218,659 B2
(45) Date of Patent: Dec. 22, 2015

(54) METHOD AND APPARATUS FOR OBTAINING A MAGNETIC RESONANCE SPECTRUM OF A VOXEL IN A MAGNETIC RESONANCE IMAGE

(71) Applicants: Samsung Electronics Co., Ltd., Gyeonggi-do (KR); Industry-Academic Cooperation Foundation, Yonsei University, Seoul (KR)

(72) Inventors: Dong-hyun Kim, Seoul (KR); Min-oh Kim, Seoul (KR); Yoon-ho Nam, Seoul (KR); Joon-sung Lee, Seoul (KR); Eun-hae Joe, Seoul (KR)

(73) Assignees: Samsung Electronics Co., Ltd., Yeongtong-gu, Suwon-si, Gyeonggi-do (KR); Industry-Academic Cooperation Foundation, Yonsei University, Yonsei-ro, Seodaemun-gu, Seoul (KR)

( * ) Notice: Subject to any disclaimer, the term of this patent is extended or adjusted under 35 U.S.C. 154(b) by 104 days.

(21) Appl. No.: 13/927,427

(22) Filed: Jun. 26, 2013

(65) Prior Publication Data
US 2014/0233813 A1 Aug. 21, 2014

(30) Foreign Application Priority Data
Feb. 20, 2013 (KR) .................. 10-2013-0018237

(51) Int. Cl.
| G06K 9/00 | (2006.01) |
| G06T 7/00 | (2006.01) |
| G06K 9/52 | (2006.01) |
| G01R 33/48 | (2006.01) |
| G01R 33/483 | (2006.01) |
| G01R 33/485 | (2006.01) |

(52) U.S. Cl.
CPC ............ *G06T 7/0012* (2013.01); *G01R 33/483* (2013.01); *G01R 33/485* (2013.01); *G01R 33/4818* (2013.01); *G06K 9/52* (2013.01)

(58) Field of Classification Search
CPC .... G06K 9/52; G06T 7/0012; G01R 33/4818; G01R 33/483; G01R 33/485
See application file for complete search history.

(56) References Cited

U.S. PATENT DOCUMENTS

| 4,480,228 A | 10/1984 | Bottomley |
| 5,072,182 A | 12/1991 | Derby et al. |
| 5,804,966 A | 9/1998 | Hurd |
| 6,046,589 A * | 4/2000 | Lamerichs et al. ........... 324/309 |

(Continued)

FOREIGN PATENT DOCUMENTS

| JP | 2012-95686 A | 5/2012 |
| JP | 2012-95697 A | 5/2012 |

OTHER PUBLICATIONS

Brooker, et al.; "Selective Fourier Transform Localization"; Magnetic Resonance in Medicine 5, 417-433; Jul. 2, 1987; Academic Press, Inc.

(Continued)

*Primary Examiner* — Tom Y Lu
(74) *Attorney, Agent, or Firm* — Cha & Reiter, LLC

(57) ABSTRACT

A method obtains a magnetic resonance (MR) spectrum of a voxel in a magnetic resonance (MR) image obtained from a magnetic resonance imaging (MRI) apparatus. The method includes configuring a sampling pattern of k-space data; sampling predetermined data from the k-space data based on the configured sampling pattern; and obtaining the MR spectrum of the voxel by using the sampled data.

10 Claims, 4 Drawing Sheets

(56) References Cited

U.S. PATENT DOCUMENTS

| | | | |
|---|---|---|---|
| 6,137,290 | A | 10/2000 | Hurd et al. |
| 6,541,971 | B1 | 4/2003 | Dannels |
| 7,319,784 | B2 | 1/2008 | Ryner et al. |
| 7,411,396 | B1* | 8/2008 | Schirmer et al. ............. 324/309 |
| 2006/0255802 | A1* | 11/2006 | Hirata et al. ................. 324/318 |
| 2007/0182411 | A1* | 8/2007 | Bammer et al. ............. 324/307 |
| 2009/0285463 | A1 | 11/2009 | Otazo et al. |
| 2012/0313641 | A1 | 12/2012 | Labadie et al. |

OTHER PUBLICATIONS

Hu, et al.; "SLIM: Spectral Localization by Imaging"; Magnetic Resonance in Medicine 8, 314-322; Apr. 25, 1988; Academic Press, Inc.

Mareci, et al.; "Essential Considerations for Spectral Localization Using Indirect Gradient Encoding of Spatial Information"; Journal of Magnetic Resonance 92, 229-246; Sep. 27, 1990; Academic Press, Inc.

Ponder, et al.; "A Novel Sampling Method for 31P Spectroscopic Imaging with Improved Sensitivity, Resolution, and Sidelobe Suppression"; Journal of Magnetic Resonance, Series B 104, 85-88; Jan. 24, 1994; Academic Press, Inc.

Plevritis, et al.; "MRS Imaging Using Anatomically Based K-Space Sampling and Extrapolation"; Magnetic Resonance in Medicine; Jul. 21, 1995; Williams & Wilkins.

Loffler, et al.; "Localized Spectroscopy from Anatomically Matched Compartments: Improved Sensitivity and Localization for Cardiac 31P MRS in Humans"; Journal of Magnetic Resonance 134, 287-299; Apr. 23, 1998; Academic Press, Inc.

Sarkar, et al.; "Truncation artifact reduction in spectroscopic imaging using a dual-density spiral k-space trajectory"; Magnetic Resonance Imaging 20, 743-757; Sep. 17, 2002; Elsevier Science Inc.

Greiser, et al.; "Efficient k-space Sampling by Density-Weighted Phase-Encoding"; Magnetic Resonance in Medicine 50, 1266-1275; Aug. 8, 2003; Wiley-Liss, Inc.

Sylvia K. Plevritis et al., MRS Imaging Using Anatomically Based K-Space Sampling and Extrapolation, XP000538742, Magnetic Resonance in Medicine, vol. 34, No. 5, Nov. 1995, pp. 686-693.

* cited by examiner

METHOD AND APPARATUS FOR OBTAINING A MAGNETIC RESONANCE SPECTRUM OF A VOXEL IN A MAGNETIC RESONANCE IMAGE

CROSS RELATED APPLICATION

This application claims, pursuant to 35 USC 119(a), priority to and the benefit of the earlier filing date of Korean Patent Application No. 10-2013-0018237, filed on Feb. 20, 2013, in the Korean Intellectual Property Office, the disclosure of which is incorporated herein in its entirety by reference.

BACKGROUND

1. Field of the Invention

The present disclosure relates to a method and apparatus for obtaining the magnetic resonance (MR) spectrum of a voxel of an MR image, and more particularly, to a method and apparatus for obtaining an MR spectrum of a single voxel by using sampled data obtained by using a predetermined sampling pattern.

2. Description of the Related Art

Magnetic resonance spectroscopy (MRS) is a method of non-invasively obtaining an image of an object body for showing, for example, the distribution of metabolites of body organs or biochemical information.

An MRS image (MRSI) includes in each image voxel thereof spectrum information of a metabolite. Therefore, in order to understand the distribution of metabolites or biochemical information of body organs, voxels having precise spatial information have to be obtained.

Single voxel spectroscopy (SVS) is a basic technology for obtaining an MR spectrum of a single voxel in order to identify the biochemical distribution of metabolites in a certain voxel.

Generally, in SVS, a three-direction selection is performed by using point-resolved spectroscopy (PRESS) pulses with a 90-180-180 degree sequence, and a signal is received from a voxel located at a portion where the three selected directions cross each other to obtain an MR spectrum.

When the three directions are selected, a chemical shift excitation occurs. Thus, due to the chemical shift excitation, not only biochemical information of the user selected region including the voxel but also information of a region outside of a user selected region may be obtained.

Therefore, it is difficult to obtain precise metabolite information or biochemical information of the region including the voxel selected by the user.

In the prior art, in order to reduce effects caused by the chemical shift excitation, spatial information is obtained through a phase encoding process after performing a single voxel excitation, and only spectrum information of a single voxel region that the user is interested in is obtained.

Also, in other prior art, a region that is larger than a single voxel region that the user is interested in is excited, and then, an amount of metabolite, which is reduced due to the chemical shift excitation, is corrected.

However, according to the above examples in the prior art, a time for acquiring data collected to obtain spatial information may be increased, and a signal-to-noise ratio (SNR) may be reduced.

SUMMARY

The present invention provides a method and apparatus for obtaining a magnetic resonance (MR) spectrum of a voxel in an MR image.

According to an aspect of the present invention, there is provided a method of obtaining a magnetic resonance (MR) spectrum of a voxel in an MR image, the method including: configuring a sampling pattern of k-space data; sampling predetermined data from the k-space data based on the configured sampling pattern; and obtaining an MR spectrum of the voxel by using the sampled data.

The sampling pattern may be a sinc pattern.

The sampling pattern may include at least two different patterns according to an energy distribution of the k-space data.

The configuring of the sampling pattern of the k-space data may be performed so that a k-space data region corresponding to the voxel in the MR image may be included in the sampling pattern.

The obtaining of the MR spectrum of the voxel by using the sampled data may include: determining a frequency conversion coefficient with respect to the sampled data; and obtaining the MR spectrum of the voxel by combining the determined frequency conversion coefficient and the sampled data.

According to another aspect of the present invention, there is provided an apparatus for obtaining a magnetic resonance (MR) spectrum of a voxel in an MR image, the apparatus including: a sampling pattern configuring unit for configuring a sampling pattern of k-space data; a sampling unit for sampling predetermined data from the k-space data based on the configured sampling pattern; and a spectrum obtaining unit for obtaining an MR spectrum of the voxel by using the sampled data.

The sampling pattern configuring unit may configure the sampling pattern so that a k-space data region corresponding to the voxel in the MR image is included in the sampling pattern.

The spectrum obtaining unit may include a frequency coefficient determiner for determining a frequency conversion coefficient of the sampled data, and the spectrum obtaining unit may obtain an MR spectrum of the voxel by combining the determined frequency conversion coefficient and the sampled data.

According to another aspect of the present invention, there is provided a non-transitory computer-readable storage medium having recorded thereon a program for executing the above method.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
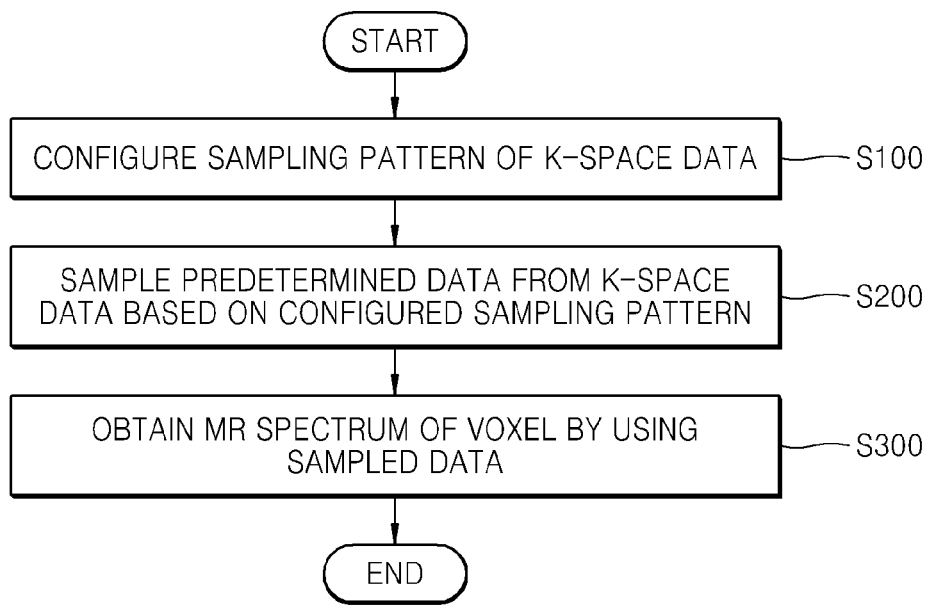
FIG. 1 is a flowchart illustrating a method of obtaining a magnetic resonance (MR) spectrum of a voxel in an MR image, according to an exemplary embodiment of the present invention.

The terminology used herein will now be briefly described as the present invention will be described in detail based on this terminology.

Exemplary embodiments of the present invention will be described with reference to the accompanying drawings. In the following description, a detailed explanation of known related functions and constructions may be omitted to avoid unnecessarily obscuring the subject matter of the present invention. The principles and features of the present invention may be employed in varied and numerous exemplary embodiments without departing from the scope of the present invention.

Furthermore, although the drawings represent exemplary embodiments of the present invention, the drawings are not necessarily to scale and certain features may be exaggerated or omitted in order to more clearly illustrate and explain the present invention.

Although general terms widely used at present were selected for describing the present invention in view of the functions thereof, these general terms may vary according to intentions of one of ordinary skill in the art, case precedents, the advent of new technologies, and the like. Terms arbitrarily selected by the applicant of the present invention may also be used in a specific case. In this case, their meanings need to be given in the detailed description of the present invention. Hence, the terms must be defined based on their meanings and the contents of the entire specification, not by simply stating the terms.

It will be understood that the terms "comprises" and/or "comprising" or "includes" and/or "including" when used in this specification, specify the presence of stated elements, but do not preclude the presence or addition of one or more other elements. Terms such as "unit" and "module" stated in the specification refer to units that process at least one function or operation, and they may be implemented by using hardware, software, or a combination of hardware and software.

The present invention will now be described more fully with reference to the accompanying drawings, in which exemplary embodiments of the present invention are shown. The present invention may, however, be embodied in many different forms and should not be construed as being limited to the exemplary embodiments set forth herein. In the drawings, parts irrelevant to the description are omitted for simplicity of explanation, and like numbers refer to like elements throughout. Expressions such as "at least one of", when preceding a list of elements, modify the entire list of elements and do not modify the individual elements of the list.

Throughout the specification, the term "magnetic resonance imaging (MRI)" refers to imaging of an object body, which acquires an image, referred to herein as an "MR image", by using magnetic resonance (MR), also known as nuclear magnetic resonance (NMR).

Throughout the specification, a user may be a medical expert such as a doctor, a nurse, a medical specialist, and a medical imaging expert, or an engineer managing medical appliances; however, the present invention is not limited thereto.

An object body according to exemplary embodiments of the present invention may be a part of the human body. For example, the object body may be an organ such as the liver, heart, uterus, brain, breast, or abdomen.

Also, the object body according to exemplary embodiments of the present invention may be a phantom. The phantom refers to a material having a volume, density, and effective physical characteristics nearly equivalent to those characteristics of a living organism, and the phantom according to exemplary embodiments of the present invention may be a spherical phantom having similar properties to those of the human body or a part thereof.

According to exemplary embodiments of the present invention, data is sampled in a k-space by using a sinc type pattern, and a phase of the sampled data is obtained to acquire spatial information of a voxel that a user is interested in. Then, an MR spectrum of the voxel that the user is interested in may be obtained by using the sampled data.

According to single voxel spectroscopy (SVS) in the prior art, a large region, including the voxel that the user is interested in, is set in an MR image to excite an object body, spatial information is acquired through phase encoding of the entire MR image, and then only the voxel that the user is interested in is extracted to acquire the MR spectrum of the voxel. For example, a remaining region except for that of the voxel of interest in the large set region may be truncated to extract the voxel that the user is interested in.

However, according to the SVS in the prior art, it is necessary to perform many samplings of k-space data, and thus, a time for processing the sampling data and a time for extracting the voxel of interest may increase, and therefore, a signal-to-noise ratio (SNR) according to time may be lowered. The present invention solves these problems to reduce the time of processing of the sampling data and the extraction time, and also to increase the SNR.

Also, metabolites in the region including the voxel that the user is interested in may not be excited due to a chemical shift excitation. To address this problem, a large region that completely includes the voxel that the user is interested in may be set to excite the object body. In this case, however, signals of metabolites that are included in a region except for the voxel of interest may be further included in the large region. The present invention solves this problem by exactly extracting an MR spectrum of the voxel of interest.

According to exemplary embodiments of the present invention, a voxel that the user is interested in is reconstructed based on data that is sampled by using a predetermined sampling pattern, and thus, a time for processing data and the extraction time may be reduced, the SNR may be increased, and an MR spectrum of the voxel of interest may be exactly extracted.

Figure 5:
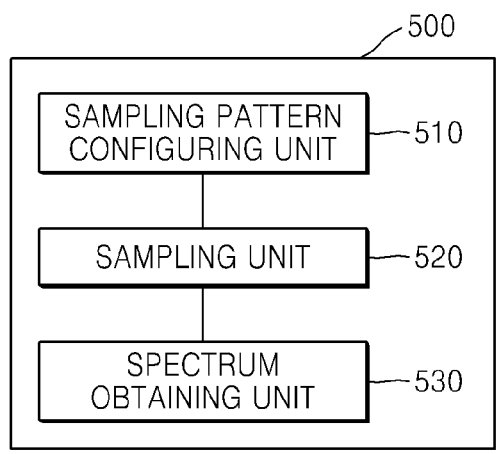
FIG. 5 is a diagram of an apparatus for obtaining the MR spectrum of the voxel in the MR image, according to the exemplary embodiment of the present invention.
Figure 6:
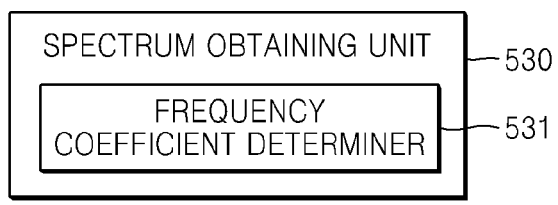
FIG. 6 is a diagram of an MR spectrum obtaining unit for obtaining the MR spectrum of the voxel in the MR image according to the exemplary embodiment of the present invention.
Figure 7:
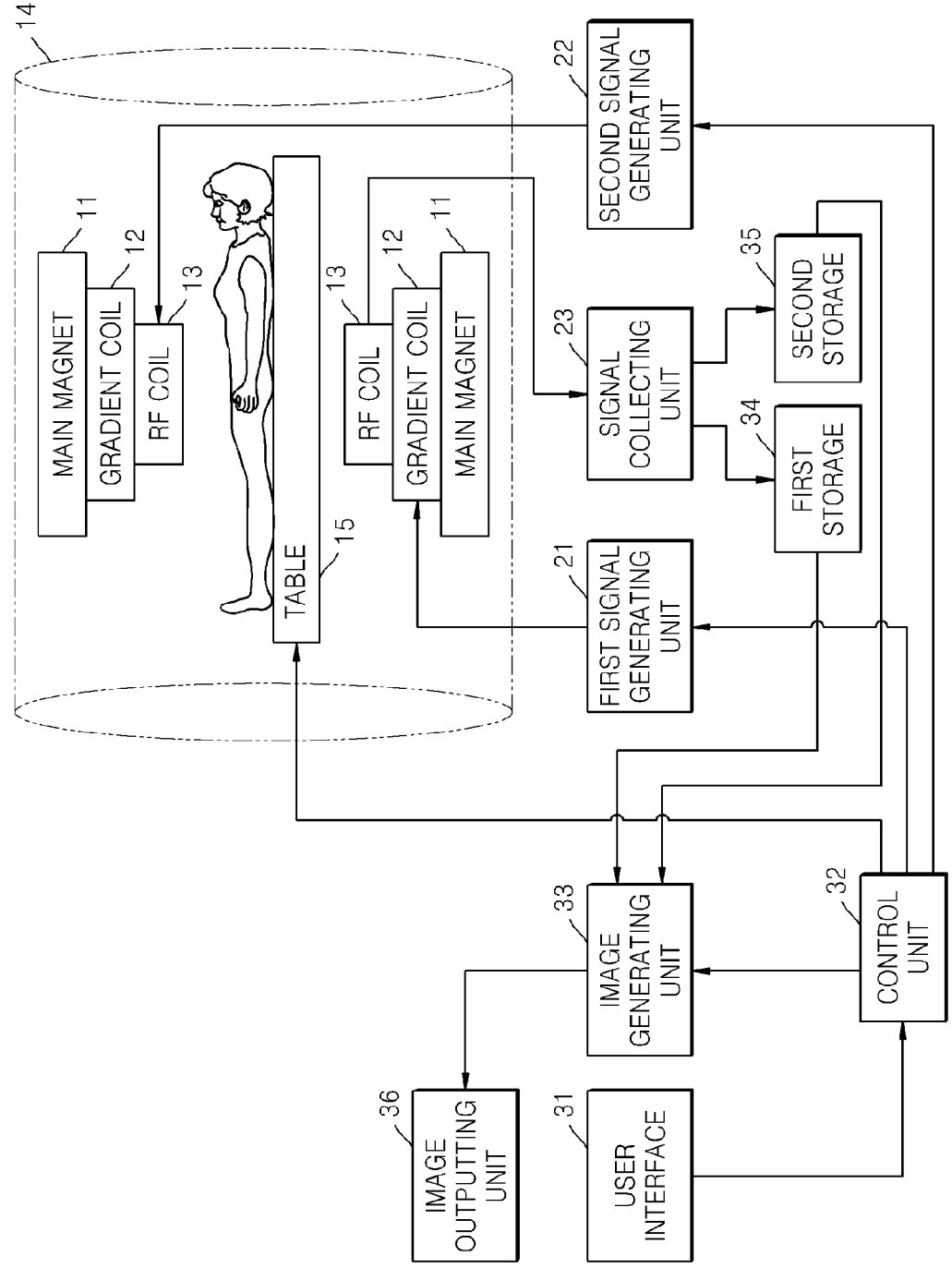
FIG. 7 is a diagram of an example MRI apparatus for implementing the present invention.

As shown in FIG. 7, a magnetic resonance imaging (MRI) apparatus of the present invention may implement the method and the various components of the present invention described in FIGS. 1-6. The MRI apparatus of FIG. 7 may include a magnet assembly 14 having a generally cylindrical shape with a hollow bore having a longitudinal axis, into which at least a portion of an object body or a subject, such as a patient, is disposed, for example, on a table 15 which may move the patient into and out of the bore. The magnet assembly 14 has at least one main magnet 11, at least one gradient coil 12, and at least one radio frequency (RF) coil 13 disposed around the bore for generating a magnetic field and for receiving an RF signal from the patient or a portion thereof, in a manner known in the art for performing MRI.

The main magnet 11 generates a main magnetic field, and a first signal generating unit 21 controls the gradient coil 12 to generate gradient magnetic fields. The second signal generating unit 22 controls the RF coil 13 to generate RF signals emitted to the patient or a portion thereof, and a signal collecting unit 23 receives RF signals from the patent or a portion thereof. At least one of a first storage 34 and a second storage 35 are used to receive and at least temporarily store the received RF signals as MRI data, which are sent to an image generating unit 33. A user interface 31 allows a user, such as a technician, diagnostician, or medical staff to control and send commands to a control unit 32 which controls the signal generating units 21, 22 and the image generating unit 33. Using the received RF signals, the image generating unit 33 generates an MR image of the patent or a portion thereof, which is output by an image outputting unit 36, which may be a display, or which may transmit the image to a network to other facilities or devices in communication with the MRI apparatus, or the image may be transmitted to another storage which may be external to the MRI apparatus.

FIG. 1 is a flowchart illustrating a method of obtaining an MR spectrum of a voxel in an MR image according to the exemplary embodiment of the present invention using the MRI apparatus of FIG. 7.

The method of obtaining the MR spectrum of the voxel in an MR image according to the exemplary embodiment of the present invention includes configuring a sampling pattern of a k-space data in step S100 sampling predetermined data from the k-space data based on the configured sampling pattern in step S200, and obtaining the MR spectrum of the voxel by using the sampled data in step S300. The method of FIG. 1 may be performed by predetermined software operated by the hardware components of the image generating unit 33 in FIG. 7. Using the user interface 31, the user of the MRI apparatus and the present invention enters a selection of the voxel of interest (VOI) on an MR image output by the image outputting unit 36, or enters a selection of a region of interest (ROI) including the VOI for a specific portion of the object such as the patient on the table 15 in the MRI apparatus.

The user interface 31 may include a keyboard and/or a mouse, as well as a display, or may include a touchscreen, with the display connected to or including the image outputting unit 36. The display may display a graphic user interface (GUI) for displaying an MR image of the patient or the ROI of the patient, allowing the user to select the VOI or the ROI by selecting a specific region in the MR image. For example, the user may select the VOI or the ROI by clicking a mouse at the VOI or the ROI, or by touching the touchscreen at a location corresponding to the VOI or the ROI. The present invention then performs step S300 using the user selection of the VOI.

The k-space according to the exemplary embodiment of the present invention refers to a set of raw data that may be used to generate one MR image.

Using the MRI apparatus shown in FIG. 7, radio frequency (RF) pulses are applied to the object body and a phase encoding gradient is changed step by step to obtain signals having location information. The obtained data is referred to as raw data, and the raw data may include location information and contrast information.

A signal having a high amplitude may be shown at a center of the k-space along a phase axis and a frequency axis, and the center of the k-space is filled with data having a low spatial resolution due to the phase encoding gradient having a small gradient and may include contrast information of tissue.

Also, an outer portion of the k-space may show a signal having a low amplitude along the phase axis and the frequency axis, and is filled with data having a high spatial resolution due to the phase encoding gradient having a large gradient to show detailed portions or a boundary between tissues in the MR image.

According to the exemplary embodiment of the present invention, a sampling pattern may be configured with respect to the k-space data in step S100. Based on the configured sampling pattern, predetermined data may be sampled from the k-space data in step S200.

Figure 2A:
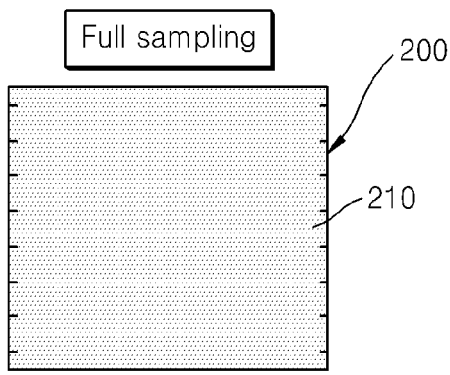
FIGS. 2A and 2B are diagrams respectively showing full-sampling according to the prior art and sync-pattern sampling according to the exemplary embodiment of the present invention.
Figure 2B:
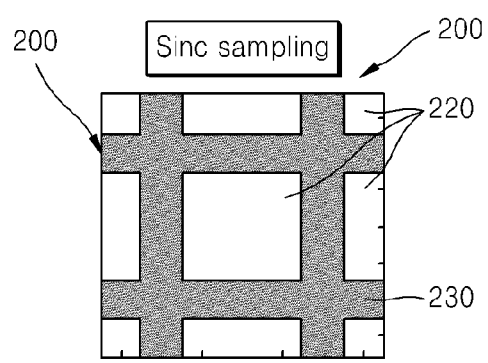

FIGS. 2A and 2B show full-sampling according to the prior art and sinc-pattern type sampling according to an embodiment of the present invention, respectively.

As shown in the prior art in FIG. 2A, full-sampling 210 may be performed with respect to a k-space 200; however, a speed of processing such data may be reduced.

Figure 3:
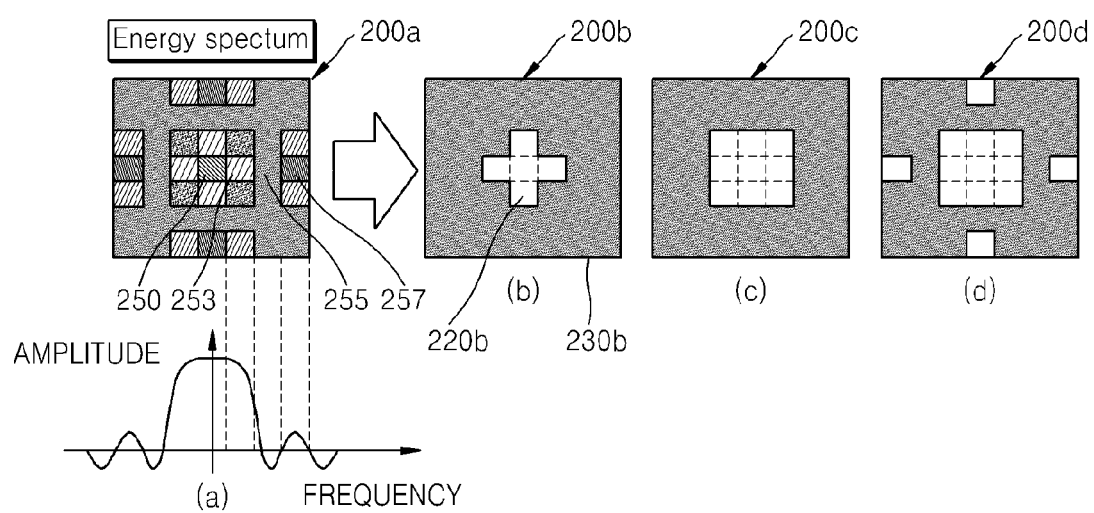
FIG. 3 is a diagram showing sampling patterns of different shapes, according to the exemplary embodiment of the present invention.

According to the exemplary embodiment of the present invention in FIG. 2B, the sampling pattern may be configured as, for example, a two-dimensional sinc pattern generated by the well-known sinc waveform shown in (a) of FIG. 3. That is, according to the exemplary embodiment of the present invention, using such a sinc pattern, the sinc pattern sampling as shown in FIG. 2B may be performed. For example, the sampling may be performed based on the sinc pattern shown in (a) of FIG. 3 in order to use signals having high amplitudes.

Referring to FIG. 2B, there is no need to extract data from the black portion 230, and the sampling may be performed by extracting data from the white portions 220. Therefore, an amount of data less than that of the full sampling 210 of FIG. 2A in the prior art may be processed, and thus, using the sampling pattern of FIG. 2B by the present invention, the data processing speed may be increased and the data processing time may be reduced.

FIG. 3 shows a sampling pattern consisting of different patterns according to the exemplary embodiment of the present invention.

The sampling pattern according to the exemplary embodiment may include at least two different patterns according to an energy distribution in k-space data.

As shown in (a) of FIG. 3, the energy distribution in a k-space 200a may have, for example, a sinc shape. That is, an amplitude of the sinc shape of the energy distribution is gradually reduced from a region 250 having the highest amplitude. For example, as shown in (a) of FIG. 3, the energy distribution in the k-space may be observed as an alternately changeable pattern on a two-dimensional plane.

For example, the region 250 having the highest amplitude may have the largest energy, and then, the energy distribution may be similar to a reduction of the amplitude corresponding to each of the regions 253, 255, and 257 shown in (a) of FIG. 3.

As described above, the sampling pattern may be differently configured according to the energy distribution in the k-space data.

For example, as shown in (b) of FIG. 3, a sampling pattern 200b may be configured to include a region 220b corresponding to the regions 250 and 253 of (a) in FIG. 3. The data included in the region 220b may be sampled by using only the sampling pattern 200b. In this example, five pieces or regions of data included in the region 220b, represented by white regions, may be sampled. That is, data included in a region 230b may not be sampled.

Also, as shown in (c) and (d) of FIG. 3, sampling patterns 200c and 200d, respectively, having different shapes may be configured. For example, nine regions of data, represented by white regions, may be sampled by using the sampling pattern 200c, and thirteen regions of data, represented by white regions, may be sampled by using the sampling pattern 200d.

According to the exemplary embodiment of the present invention, the configuring of the sampling pattern with respect to the k-space in step S200 of FIG. 1 may include configuring of the sampling pattern so that the k-space data corresponding to a specific voxel of an MR image may be included in the sampling pattern.

An MR image of an object body may be acquired by performing a frequency conversion of the k-space. For example, the frequency conversion may include a Fourier inverse transformation.

A frequency encoding gradient magnetic field and a phase encoding gradient magnetic field in the k-space, generated by the gradient coil 12 in FIG. 7, may provide a location of a signal in the MR image. That is, each piece or region of data in the k-space may configure an image of the MR photographed object body at a predetermined location in the MR image according to the frequency encoding gradient magnetic field and the phase encoding gradient magnetic field in the k-space.

Therefore, the k-space data corresponding to the voxel that the user is interested in may be obtained by using the frequency encoding gradient magnetic field and the phase encoding gradient magnetic field, and the sampling pattern may be configured so that the obtained k-space data may be included in the sampling pattern.

Figure 4:
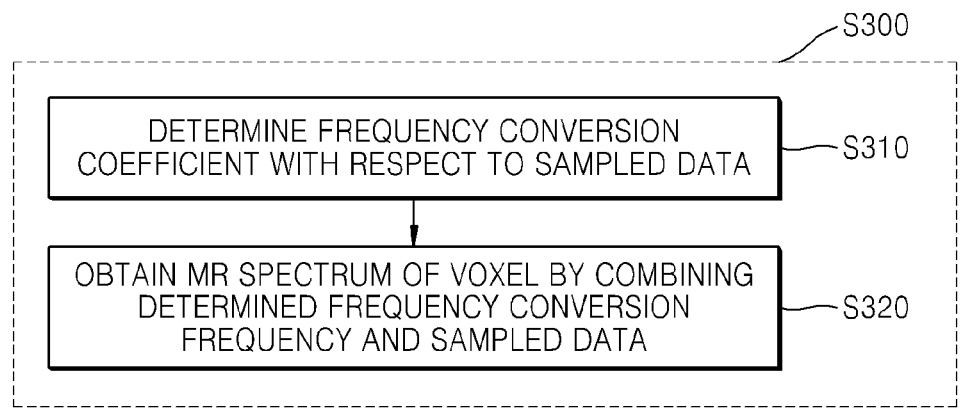
FIG. 4 is a flowchart illustrating a method of obtaining the MR spectrum of the voxel by using sampled data, according to the exemplary embodiment of the present invention.

FIG. 4 is a flowchart illustrating a method of obtaining an MR spectrum of a voxel by using sampled data, according to the exemplary embodiment of the present invention. The method of FIG. 4 may be performed by predetermined software operated by the hardware components of the image generating unit 33 in FIG. 7.

According to the exemplary embodiment of the present invention, a spectrum of a voxel of interest (VOI) may be exactly reconstructed by using the sampled data that is sampled based on the above described sampling pattern.

Each piece of sampled data may differently contribute to the acquisition of the MR spectrum of the VOI, and the MR spectrum of the VOI may be relatively exactly reconstructed according to contribution degrees of each data. For example, in order to exactly reconstruct the MR spectrum of the VOI, predetermined coefficients (for example, a frequency conversion coefficient, and the like) that will be used in a reconstruction process have to be determined.

According to the exemplary embodiment of the present invention, referring to FIG. 4, the obtaining of the MR spectrum of the voxel by using the sampled data by step S300 in FIG. 1 may include determining a frequency conversion coefficient of the sampled data in step S310, and obtaining the MR spectrum of the voxel by combining the determined frequency conversion coefficient and the sampled data in step S320.

The k-space data, represented by a variable d, for a frequency f that is sampled based on the above-described sampling pattern in (a) of FIG. 3 may be represented as a linear combination of image information I of the object body, obtained from the signal collecting unit 23 via at least one of the storages 34, 35 in FIG. 7. The linear combination may be represented by using Equation (1) via, for example, Fourier coefficients F.

$$d_f(kx, ky) = \sum_{(x,y)} F_{kx,ky}(x, y) I_f(x, y) \quad (1)$$

The image information I in a region of interest (ROI) including the VOI may be represented by using the k-space data and using Equation (2) below. Here, $S^{ideal}(f)$ may refer to a spectrum corresponding to the desired image information I.

$$S^{ideal}(f) = \sum_{(x,y) \in ROI} I_f(x, y) \quad (2)$$

Therefore, a predetermined coefficient c that is used to reconstruct the MR spectrum of the VOI may be determined to be approximately equal to $S^{ideal}(f)$ in Equation (2) above. That is, the predetermined coefficient c that will be used to reconstruct the MR spectrum of the VOI may be obtained by using, for example, Equation (3) below.

$$S^{ideal}(f) \approx \sum_{(kx,ky)} c_{kx,ky} d_f(kx, ky) = \sum_{(x,y)} \left( \sum_{(kx,ky)} c_{kx,ky} F_{kx,ky}(x, y) \right) I_f(x, y) \quad (3)$$

Also, the coefficient c represented by Equation (3) may be determined as a coefficient that minimizes Equation (4) through L2 minimization.

$$\sum_{(x,y) \in ROI} \left\| \sum_{(kx,ky)} c_{kx,ky} F_{kx,ky}(x, y) - 1 \right\|^2 + \sum_{(x,y) \notin ROI} \left\| \sum_{(kx,ky)} c_{kx,ky} F_{kx,ky}(x, y) \right\|^2 \quad (4)$$

Also, the coefficient c obtained by using Equation (4) may be normalized by Equation (5) below. A relatively exact amount of metabolites may be measured by using the normalized coefficient $c^{norm}$ even when the metabolites in the object body are evenly distributed, and thus, the accuracy of reconstructing the spectrum in the VOI may be adjusted.

$$c_{kx,ky}^{norm} = c_{kx,ky} \bigg/ \sum_{(x,y)} \sum_{(kx,ky)} c_{kx,ky} F_{kx,ky}(x, y) \quad (5)$$

For example, the spectrum S in the VOI may be reconstructed as a linear combination represented by using Equation (6) via the coefficients obtained from Equation (5).

$$S(f) = \sum_{(kx,ky)} c_{kx,ky}^{norm} d_f(kx, ky) \quad (6)$$

FIG. 5 is a block diagram of an apparatus 500 for obtaining the MR spectrum of the voxel in the MR image, according to the exemplary embodiment of the present invention. The apparatus 500 may be implemented in the image generating unit 33 of FIG. 7.

The apparatus 500 for obtaining the MR spectrum of the voxel in the MR image includes a sampling pattern configuration unit 510 configuring a sampling pattern of the k-space data, a sampling unit 520 for sampling predetermined data from the k-space data based on the configured sampling pattern, and a spectrum obtaining unit 530 obtaining the MR spectrum of the voxel by using the sampled data.

The sampling pattern according to the exemplary embodiment of the present invention may be a sinc pattern, as shown in (a) in FIG. 3.

The sampling pattern according to the exemplary embodiment of the present invention may be configured to include at least two different patterns according to an energy distribution of the k-space data, as shown in (b), (c), and (d) of FIG. 3.

The sampling pattern configuring unit 510 of the exemplary embodiment may configure the sampling pattern so that the k-space data corresponding to the voxel of the MR image may be included in the sampling pattern, such as the white or gray regions in (a) of FIG. 3, or at least one of the white regions in (b), (c), and (d) of FIG. 3, respectively; for example, the region 220b in (b) of FIG. 3.

FIG. 6 is a diagram showing the MR spectrum obtaining unit 530 for obtaining the MR spectrum of the voxel in the MR image, according to the exemplary embodiment of the present invention.

The MR spectrum obtaining unit 530 of the exemplary embodiment may include a frequency coefficient determiner 531 for determining a frequency conversion coefficient of the sampled data.

The MR spectrum obtaining unit 530 of the exemplary embodiment may obtain the MR spectrum of the voxel by combining the determined frequency conversion coefficient and the sampled data. The MR spectrum is then output in step S320 in FIG. 4 by the spectrum obtaining unit 530, by the image outputting unit 36, and/or by a display or GUI of the user interface 31, so that the user uses the MR spectrum to identify the biochemical distribution of metabolites in a certain voxel, for example, for diagnosing a disease or abnormality at the VOI or ROI of the object corresponding to the voxel.

Descriptions of the above method may be included in the description of the apparatus according to the embodiments of the present invention. Thus, descriptions of like elements are not provided again.

The above-described embodiments of the present invention may be written as computer programs and may be implemented in general-use digital computers that execute the programs by using a non-transitory computer-readable storage medium.

Examples of the non-transitory computer-readable storage medium include magnetic storage media (e.g., ROM, floppy disks, hard disks, etc.), optical storage media (e.g., CD-ROMs or DVDs), etc.

The above-described apparatus and methods according to the present invention can be implemented in hardware or firmware, or as software or computer code, or combinations thereof. Various components such as a controller, a central processing unit (CPU), a processor, and any unit or device described herein includes at least hardware and/or other physical structures and elements. In addition, the software or computer code can also be stored in a non-transitory recording medium such as a CD ROM, a RAM, a ROM whether erasable or rewritable or not, a floppy disk, CDs, DVDs, memory chips, a hard disk, a magnetic storage media, an optical recording media, or a magneto-optical disk or computer code downloaded over a network originally stored on a remote recording medium, a computer readable recording medium, or a non-transitory machine readable medium and to be stored on a local recording medium, so that the methods described herein can be rendered in such software, computer code, software modules, software objects, instructions, applications, applets, apps, etc. that is stored on the recording medium using a general purpose computer, a digital computer, or a special processor or in programmable or dedicated hardware, such as an ASIC or FPGA. As would be understood in the art, the computer, the processor, microprocessor controller or the programmable hardware include volatile and/or non-volatile storage and memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. In addition, the program may be electronically transferred through any medium such as communication signals transmitted by wire/wireless connections, and their equivalents. The programs and computer readable recording medium can also be distributed in network-coupled computer systems so that the computer readable code is stored and executed in a distributed fashion.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of obtaining a magnetic resonance (MR) spectrum of a voxel in an MR image of an object, the method comprising:
    configuring a sampling pattern of k-space data by a sampling pattern configuring unit of an image generating unit;
    sampling predetermined data from the k-space data based on the configured sampling pattern by a sampling unit of the image generating unit;
    obtaining an MR spectrum of the voxel by using the sampled data by a spectrum obtaining unit of the image generating unit; and
    displaying by an image outputting unit the MR spectrum of the voxel,
    wherein the sampling pattern includes at least two different patterns according to an energy distribution of the k-space data.

2. The method of claim 1, wherein the sampling pattern is a sinc pattern.

3. The method of claim 1, wherein the configuring of the sampling pattern of the k-space data is performed so that a k-space data region corresponding to the voxel in the MR image is included in the sampling pattern.

4. The method of claim 1, wherein the obtaining of the MR spectrum of the voxel by using the sampled data comprises:
    determining a frequency conversion coefficient with respect to the sampled data; and
    obtaining the MR spectrum of the voxel by combining the determined frequency conversion coefficient and the sampled data.

5. An apparatus for obtaining a magnetic resonance (MR) spectrum of a voxel in an MR image, the apparatus comprising:
    a sampling pattern configuring unit for configuring a sampling pattern of k-space data;
    a sampling unit for sampling predetermined data from the k-space data based on the configured sampling pattern;
    a spectrum obtaining unit for obtaining an MR spectrum of the voxel by using the sampled data; and
    a display for displaying the obtained MR spectrum of the voxel.

6. The apparatus of claim 5, wherein the sampling pattern is a sinc pattern.

7. The apparatus of claim 5, wherein the sampling pattern includes at least two different patterns according to an energy distribution of the k-space data.

8. The apparatus of claim 5, wherein the sampling pattern configuring unit configures the sampling pattern so that a k-space data region corresponding to the voxel in the MR image is included in the sampling pattern.

9. The apparatus of claim 5, wherein the spectrum obtaining unit comprises a frequency coefficient determiner for determining a frequency conversion coefficient of the sampled data, and the spectrum obtaining unit obtains an MR spectrum of the voxel by combining the determined frequency conversion coefficient and the sampled data.

10. A non-transitory computer-readable storage medium having recorded thereon a program that, when executed by a processor, performs the method of claim 1.

* * * * *